(12) United States Patent
Ishimaru et al.

(10) Patent No.: US 9,714,750 B2
(45) Date of Patent: Jul. 25, 2017

(54) VEHICULAR DISPLAY APPARATUS

(71) Applicant: DENSO CORPORATION, Kariya, Aichi-pref. (JP)

(72) Inventors: Tadaaki Ishimaru, Kariya (JP); Takayuki Hiromitsu, Kariya (JP)

(73) Assignee: DENSO CORPORATION, Kariya, Aichi-pref.

( * ) Notice: Subject to any disclaimer, the term of this patent is extended or adjusted under 35 U.S.C. 154(b) by 385 days.

(21) Appl. No.: 14/415,080

(22) PCT Filed: May 16, 2013

(86) PCT No.: PCT/JP2013/003127
§ 371 (c)(1),
(2) Date: Jan. 15, 2015

(87) PCT Pub. No.: WO2014/013658
PCT Pub. Date: Jan. 23, 2014

(65) Prior Publication Data
US 2015/0184824 A1 Jul. 2, 2015

(30) Foreign Application Priority Data
Jul. 16, 2012 (JP) ................................. 2012-158225

(51) Int. Cl.
*F21S 8/10* (2006.01)
*G01D 11/28* (2006.01)
(Continued)

(52) U.S. Cl.
CPC .............. *F21S 48/328* (2013.01); *B60Q 3/14* (2017.02); *G01D 11/28* (2013.01); *G01D 13/28* (2013.01);
(Continued)

(58) Field of Classification Search
CPC B60Q 3/14; B60Q 3/10; F21S 48/328; G01D 11/28; H05K 7/20845
(Continued)

(56) References Cited

U.S. PATENT DOCUMENTS 3,701,895 A * 10/1972 Sweetser .................. F21S 8/02
362/264
D748,319 S * 1/2016 Johnson ....................... D26/118

FOREIGN PATENT DOCUMENTS

JP S62195715 U 12/1987
JP H02034708 Y 9/1990
(Continued)

OTHER PUBLICATIONS

Office Action dated Feb. 1, 2016 in corresponding Chinese Application No. 201380037770.7 with English translation.
(Continued)

*Primary Examiner* — Robert May
*Assistant Examiner* — Leah S Macchiarolo
(74) *Attorney, Agent, or Firm* — Harness, Dickey & Pierce, P.L.C.

(57) ABSTRACT

A vehicular display apparatus includes: first illumination portions that illuminate first display areas from behind by luminescence of a plurality of first light sources; first cover portions that are placed behind the first display areas and internally expose the first light sources; a second illumination portion that illuminates a second display area from behind by luminescence of a plurality of second light sources; and a second cover portion that is placed behind the second display area and has an interior partitioned from the interiors of the adjoining first cover portions while internally exposing the second light sources. The first cover portions externally form an air passage for an air flow. The second cover portion has an air hole opened to communicate the
(Continued)

interior of the second cover portion with the air passage external to the first cover portion.

8 Claims, 10 Drawing Sheets

(51) Int. Cl.
*G01D 13/28* (2006.01)
*H05K 7/20* (2006.01)
*B60Q 3/14* (2017.01)

(52) U.S. Cl.
CPC ..... *H05K 7/20009* (2013.01); *H05K 7/20845* (2013.01)

(58) Field of Classification Search
USPC ......... 362/23.07, 23.12, 23.11, 23.14, 23.18, 362/23.19, 23.2
See application file for complete search history.

(56) References Cited

FOREIGN PATENT DOCUMENTS

| JP | H03006674 U | 1/1991 |
|----|-------------|--------|
| JP | H03014694 Y | 4/1991 |
| JP | H06235647 A | 8/1994 |
| JP | H10318798 A | 12/1998 |
| JP | 2003270001 A | 9/2003 |

OTHER PUBLICATIONS

International Search Report and Written Opinion (in Japanese with English Translation) for PCT/JP2013/003127, mailed Jul. 9, 2013; ISA/JP.

* cited by examiner

VEHICULAR DISPLAY APPARATUS

CROSS REFERENCE TO RELATED APPLICATIONS

This application is a U.S. National Phase Application under 35 U.S.C. 371 of International Application No. PCT/JP2013/003127 filed on May 16, 2013 and published in Japanese as WO 2014/013658 on Jan. 23, 2014. This application is based on and claims the benefit of priority from Japanese Patent Application No. 2012-158225 filed on Jul. 16, 2012. The entire disclosures of all of the above applications are incorporated herein by reference.

TECHNICAL FIELD

The present disclosure relates to a vehicular display apparatus that displays vehicle information.

BACKGROUND ART

There is conventionally known a vehicular display apparatus that illuminates a plurality of display areas for displaying vehicle information from behind using respective light sources.

For example, each vehicular display apparatus disclosed in Patent Literatures 1 and 2 includes a cover portion, which exposes a light source to the inside of the cover portion itself, behind each display area. This can avoid a situation mixing together the light beams of light sources illuminating respective display areas, thus precisely illuminating and displaying only necessary information among the vehicle information in the individual display areas.

The vehicular display apparatus disclosed in Patent Literature 1 includes an air hole in the top wall of a cover portion behind each display area. Heat produced by a light source is thereby dissipated from inside of the cover portions to enhance durability. The vehicular display apparatus disclosed in Patent Literature 2 includes an air passage for passing air beside the outside of vertically adjoining cover portions. Heat produced by a light source is thereby let to escape from the inside of the cover portions to enhance durability.

PRIOR ART LITERATURES

Patent Literature

Patent Literature 1: JP H6-235647 A
Patent Literature 2: JP 2003-270001 A

When cover portions are placed to vertically adjoin to each other as in the vehicular display apparatus disclosed in Patent Literature 2, the temperature of the light sources cannot be sufficiently reduced just by providing an air passage outside the cover portions. Therefore, it is desirable to add a modification to provide an air hole in each cover portion as in the vehicular display apparatus disclosed in Patent Literature 1. However, this modification needs to provide an air hole in the top wall of the lower cover portion, that is, the partition wall that partitions the interiors of the upper and lower cover portions from each other. This may mix together the light beams from the light sources through the air hole in the partition wall.

SUMMARY OF INVENTION

It is an object of the present disclosure to achieve precise display of vehicle information by a vehicular display apparatus with high durability and high energy efficiency.

According to an aspect of the present disclosure, a vehicular display apparatus is provided to include a display portion, a first illumination portion, a first cover portion, a second illumination portion, and a second cover portion. The display portion displays vehicle information in each of a first display area and a second display area. The first illumination portion illuminates the first display area from behind by causing at least one first light source to emit light. The first cover portion is placed behind the first display area, and exposes the at least one first light source included in the first illumination portion to an interior of the first cover portion. The second illumination portion illuminates the second display area from behind by causing at least one second light source to emit light. The second cover portion is placed behind the second display area, adjoins to the first cover portion vertically, and has an interior that is partitioned from the interior of the first cover portion. The second cover portion exposes the at least one second light source included in the second illumination portion to the interior of the second cover portion. Herein, the first cover portion forms an air passage outside of the first cover portion for an air flow. The second cover portion includes an air hole that is opened to communicate the interior of the second cover portion with the air passage outside of the first cover portion.

According to the aspect, of vertically adjoining first cover portion and second cover portion, the second cover portion is provided with an air hole that is opened to communicate the interior of the second cover portion with an external air passage. As a result, an air flow by natural convection is produced through the air hole between the external air passage and the interior of the second cover portion where at least one second light source is exposed. As a result, reduction in the temperature of the second light source is accelerated to enhance durability. Meanwhile, the first cover portion having at least one first light source exposed therein does not require such an air hole as in the second cover portion and an air passage only has to be externally formed. This can avoid the leakage of the light beams from the light sources through the air hole to enhance energy efficiency. In addition, the interiors of the vertically adjoining first cover portion and second cover portion are partitioned from each other; this can avoid the mixture of the light beams from the light sources in the cover portions, thereby precisely illuminating and displaying only required information among a variety of the vehicle information in the individual display areas.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
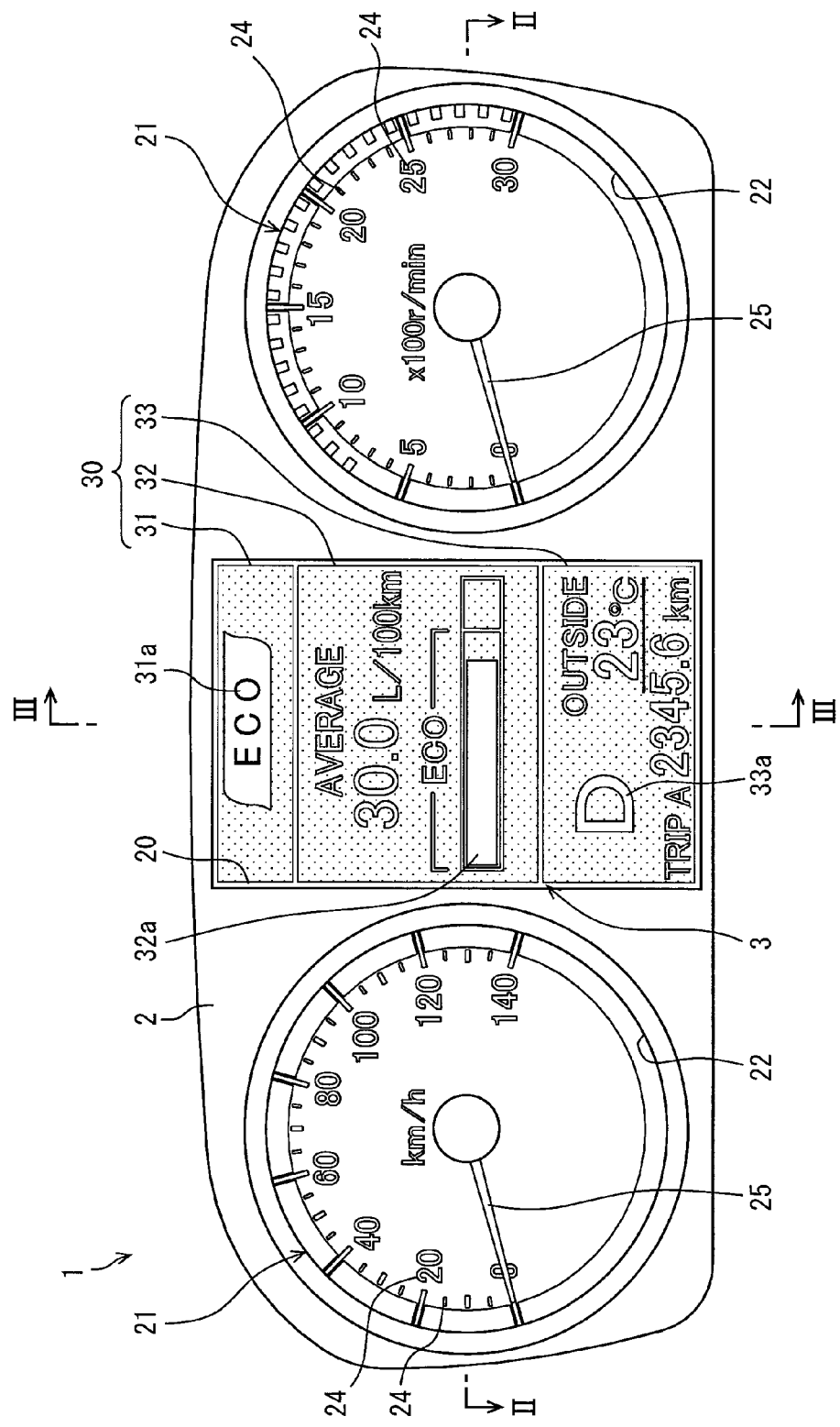
FIG. 1 is a front view of a vehicular display apparatus in an embodiment of the present disclosure.
Figure 2:
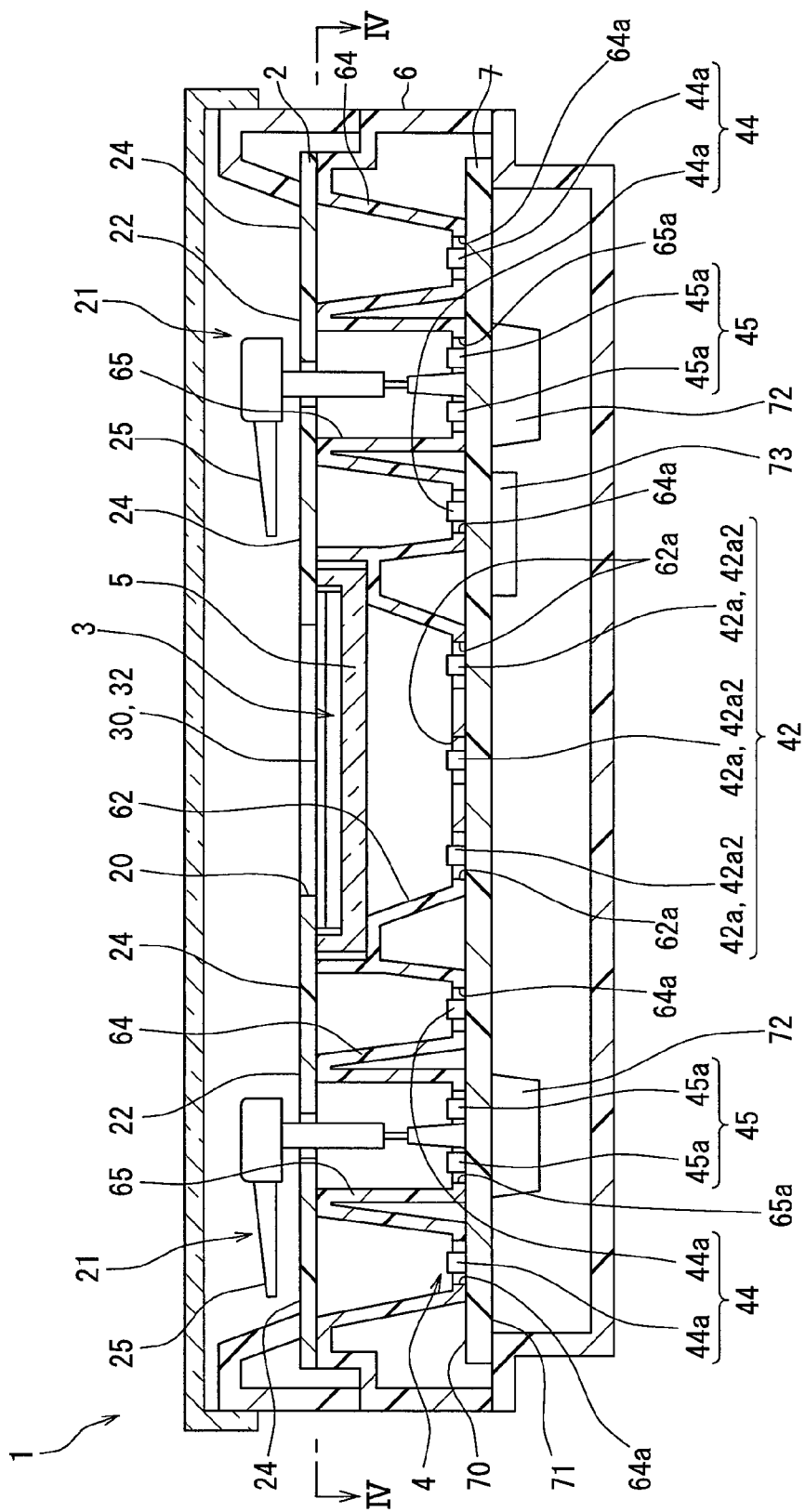
FIG. 2 is a sectional view taken along line II-II of FIG. 1.
Figure 3:
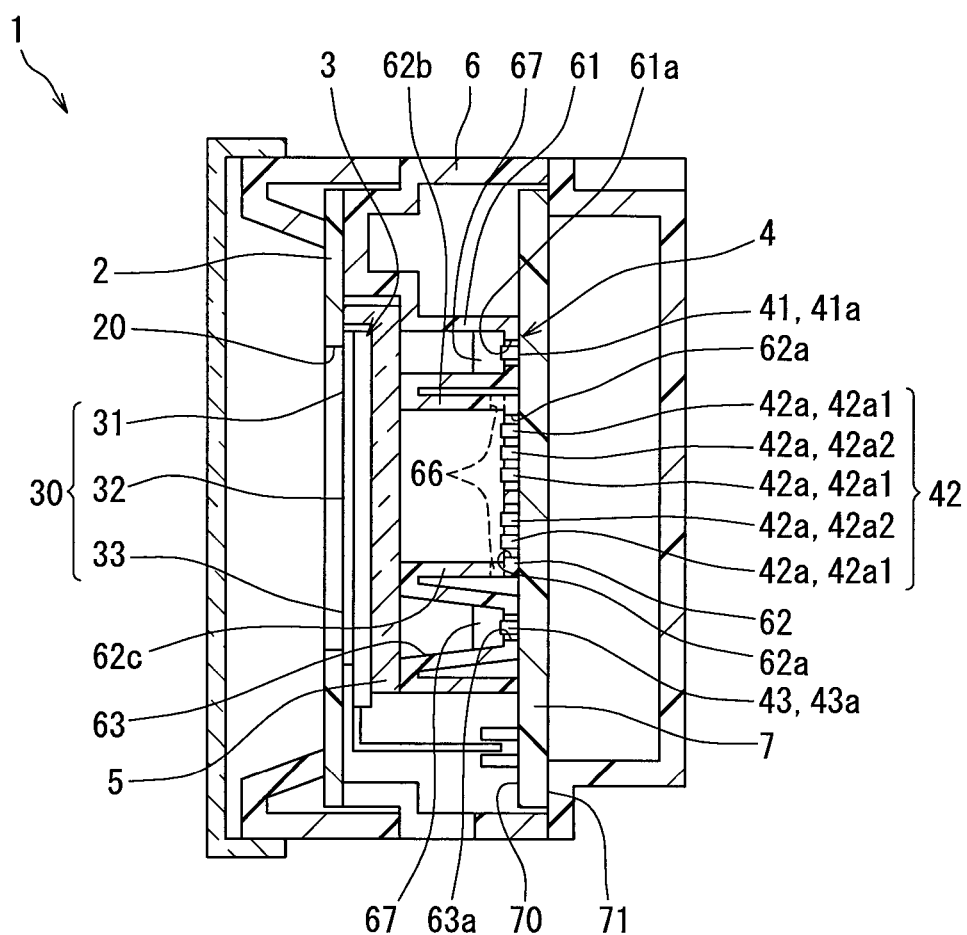
FIG. 3 is a sectional view taken along line III-III of FIGS. 1 and 4.

Hereafter, a description will be given to an embodiment of the present disclosure with reference to the drawings. As illustrated in FIGS. 1 to 3, a vehicular display apparatus 1 (hereafter, simply referred to as "apparatus 1") in the embodiment of the present disclosure is a combination meter. The combination meter provides vehicle information to a driver sitting on the driver's seat in a vehicle compartment and is installed in the instrument panel in the vehicle compartment. The left and right direction in FIGS. 1 and 2 substantially agrees with the left and right direction of the vehicle on a horizontal plane and the top and bottom direction in FIGS. 1 and 3 substantially agrees with the top and bottom direction of the vehicle on a horizontal plane.

(Basic Configuration)

The apparatus 1 includes a display plate 2, a display panel 3, an illumination unit 4, a diffuser panel 5, a light guiding case 6, and a circuit board 7.

The display plate 2 is formed of resin in the shape of flat plate and has a rectangular hole-like display window 20 in the center in the left and right direction. As illustrated in FIGS. 1 and 2, pointer instruments 21 are provided on both sides of the display window 20 in the left and right direction in the display plate 2. Each pointer instrument 21 indicates specific vehicle information by pointing a rotating translucent pointer 25 to a plurality of translucent indexes 24 which are scales or characters formed in each display area 22 of the display plate 2. In this embodiment, one pointer instrument 21 is a speedometer indicating the running speed of the vehicle and the other pointer instrument 21 is an engine tachometer indicating the engine speed of the vehicle; however, these pointer instruments may indicate any other vehicle state value.

The display panel 3 shown in FIGS. 1 to 3 is a liquid crystal panel such as TFT and has a rectangular screen 30 capable of displaying images. The display panel 3 is placed behind the display plate 2 to expose the screen 30 forward through the display window 20. The screen 30 defines previously three rectangular display areas 31, 32, 33 that are divided in the top and bottom direction. Each of the display areas 31, 32, 33 displays specific vehicle information to notify with the indicator images 31a, 32a, 33a shown in FIG. 1. The display panel 3 in this embodiment is a so-called monochrome liquid crystal panel capable of displaying white indicator images 31a, 32a, 33a in the black background. In the display panel 3, the display area 32 in the center in the top and bottom direction is designed to luminously display the indicator image 32a and change, in particular, the color of luminescence according to the level of notification. In the display panel 3, the display areas 31, 33 sandwiching the display area 32 therebetween in the top and bottom direction are designed to luminously display the indicator images 31a, 33a and maintain the color of luminescence to be constant, in particular.

As shown in FIGS. 2 and 3, the illumination unit 4 includes a plurality of illumination portions 41, 42, 43, 44, 45 and is placed behind the display plate 2. Each illumination portion 41, 42, 43, 44, 45 has a predetermined number of LEDs as light sources 41a, 42a, 43a, 44a, 45a. The illumination portions 41, 42, 43 turn on their respective component light sources 41a, 42a, 43a and cause them to emit light. The illumination portions 41, 42, 43 thereby translucently illuminate their respective corresponding ones (having reference numerals with identical last digit) of the display areas 31, 32, 33 of the display panel 3 from behind. The illumination portions 44, 45 turn on their respective component light sources 44a, 45a and cause them to emit light. The illumination portions 44, 45 thereby translucently illuminate their respective corresponding ones (having reference numerals with identical last digit) of the indexes 24 and the pointers 25 of the pointer instruments 21 from behind.

The diffuser panel 5 is formed of resin in the shape of closed end pan and is held in the light guiding case 6 in the state of supporting the display panel 3 from behind. The diffuser panel 5 diffuses light toward the screen 30 of the display panel 3, the light going from the respective light sources 41a, 42a, 43a of the illumination portions 41, 42, 43 to the corresponding areas 31, 32, 33.

The light guiding case 6 is hollowly formed of resin and holds the display plate 2 from behind. The light guiding case 6 has a plurality of cover portions 61, 62, 63, 64, 65 shaped of a closed end pan or cylinder. Each cover portion 61, 62, 63, 64, 65 includes an opening and a bottom wall behind the opening. The opening is directed frontward and is covered with the display plate 2. In addition, each cover portion 61, 62, 63, 64, 65 is provided with a predetermined number of exposure holes 61a, 62a, 63a, 64a, 65a in the bottom wall. The cover portions 61, 62, 63, 64, 65 expose, to their own interiors, the component light sources 41a, 42a, 43a, 44a, 45a of their respective corresponding ones (having reference numerals with identical last digit) of the illumination portions 41, 42, 43, 44, 45 through the their respective exposure holes 61a, 62a, 63a, 64a, 65a.

The circuit board 7 is formed of resin in the shape of flat plate and is fixed behind the light guiding case 6. On the front face 70 of the circuit board 7, the component light sources 41a, 42a, 43a, 44a, 45a of the illumination portions 41, 42, 43, 44, 45 are mounted. The front face 70 covers the exposure holes 61a, 62a, 63a, 64a, 65a of the cover portions 61, 62, 63, 64, 65 from behind. On the rear face 71 of the circuit board 7, as illustrated in FIG. 2, electronic elements, such as a driving source 72 and a control circuit 73, are mounted. The driving source 72 provided in correspondence with each pointer instrument 21 is a step motor or the like that rotationally drives the pointer 25 through the interior of the cover portions 65. The control circuit 73 is an electronic circuit such as a microcomputer and controls the following: the image display by the screen 30 of the display panel 3; turn-on/off of the component light sources 41a, 42a, 43a, 44a, 45a of the respective illumination portions 41, 42, 43, 44, 45; and the rotational driving of the pointer 25 by each driving source 72.

(Characteristic Points)

A detailed description will be given to characteristic points of the apparatus 1.

Figure 4:
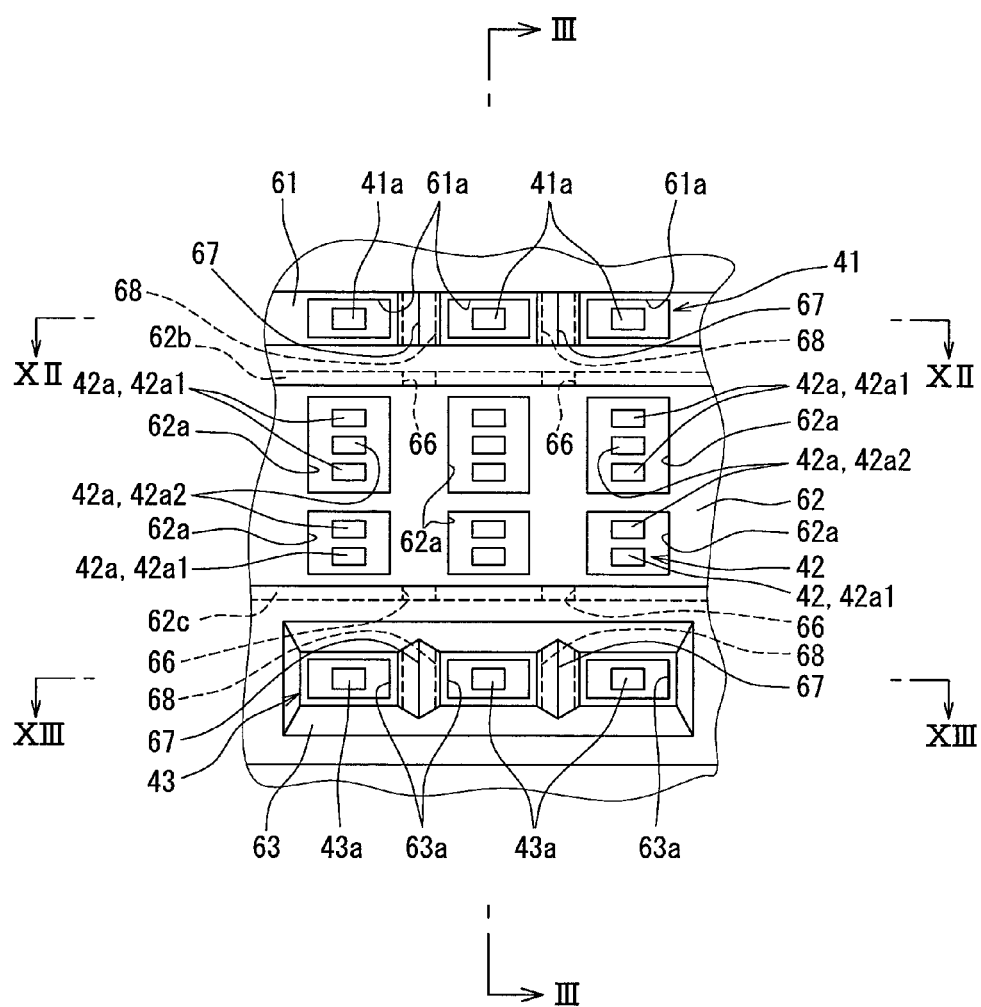
FIG. 4 is an enlarged arrow view taken along line IV-IV of FIG. 2.

As shown in FIGS. 2 to 4, the illumination portion 42 illuminating the display area 32 includes, as the plurality of component light sources 42a, light sources 42a1 whose luminescent color is a predetermined ordinary color and light sources 42a2 whose luminescent color is an alert color different from the ordinary color. This embodiment is provided with nine light sources 42a1 in the ordinary color and six light sources 42a2 in the alert color. In this embodiment, white is previously set as the ordinary color of the light sources 42a1 and red is previously set as the alert color of the light sources 42a2. As a result, the indicator image 32a (Refer to FIG. 1) is luminously displayed in white by turn-on of the light sources 42a1 and turn-off of the light sources 42a2. Further, the indicator image 32a is luminously displayed in red by turn-off of the light sources 42a1 and turn-on of the light sources 42a2. In FIG. 4, each light source 42a1, 42a2 in the part shown in FIG. 2 is not marked with a reference numeral for the sake of ease of viewing.

As shown in FIGS. 3, 4, 7, and 8, the illumination portions 41, 43 illuminating the display areas 31, 33 each include a plurality of light sources 41a, 43a whose luminescent color is the above-mentioned ordinary color. That is, the component light sources 41a, 43a of the illumination portions 41, 43 are made different in luminescent color from the light sources 42a2 in the above-mentioned alert color of the component light sources 42a of the illumination portion 42. This embodiment is provided with three light sources 41a, 43a in the ordinary color each. As a result, the indicator images 31a, 33a (Refer to FIG. 1) are luminously displayed in white by turn-on of their respective corresponding light sources 41a, 43a.

The component light sources 42a, 41a, 43a of the illumination portions 42, 41, 43 mentioned up to this point provide the respective heat quantities to be adjusted to a substantially equal value in accordance with the control of passed current by the control circuit 73 in this embodiment. In addition, the number of the component light sources 42a of the illumination portion 42 is previously set, as shown in FIGS. 3 and 4, to be larger than the number of the component light sources 41a of the illumination portion 41 and, simultaneously, to be larger than the number of the component light sources 43a of the illumination portion 43. Such adjustment and setting permits the total quantity of heat produced by all the light sources 42a at the illumination portion 42 to be larger than the total quantity of heat produced by all the light sources 41a at the illumination portion 41 and, simultaneously, to be larger than the total quantity of heat produced by the light sources 43a at the illumination portion 43.

As illustrated in FIGS. 3 to 6, the cover portion 62 includes a top wall 62b wall and a bottom wall 62c behind the display area 32. The top wall 62b and the bottom wall 62c are projected frontward, respectively, from the upper edge and the lower edge of the bottom wall having the exposure holes 62a. Each of the top and bottom walls 62b, 62c is provided with a plurality of air holes 66 for an air flow. Each air hole 66 penetrates the top and bottom walls 62b, 62c in the top and bottom direction and is thereby opened to the interior and exterior of the cover portion 62. In this embodiment, each air hole 66 in the top and bottom walls 62b, 62c is displaced from any exposure hole 62a in the left and right direction. The air holes 66 in the top wall 62b are arranged side by side in the left and right direction and opposed to the respective air holes 66 in the bottom wall 62c in the top and bottom direction. In this embodiment, the shape of each air hole 66 is rectangular but it may be any other shape including the shape of cylindrical hole and the like.

The cover portions 61, 63 placed behind the respective display areas 31, 33 are so formed that their interiors each are partitioned from the interior of the cover portion 62 to which the cover portions 61, 63 adjoin vertically from above and below, respectively. The cover portion 61 includes a plurality of chevron portions 67 in the bottom wall having the exposure holes 61a; the cover portion 63 also includes a plurality of chevron portions 67 in the bottom wall having the exposure holes 63a. Each chevron portion 67 of the cover portion 61 is provided in a place where it adjoins to an exposure hole 61a in the left and right direction, that is, a place where it adjoins to a light source 41a exposed from the exposure hole 61a (Refer to FIG. 7). Each chevron portion 67 of the cover portion 63 is provided in a place adjoining to the exposure hole 63a in the left and right direction, that is, a place adjoining to the light source 43a exposed from the exposure hole 63a (Refer to FIG. 8).

Figure 6:
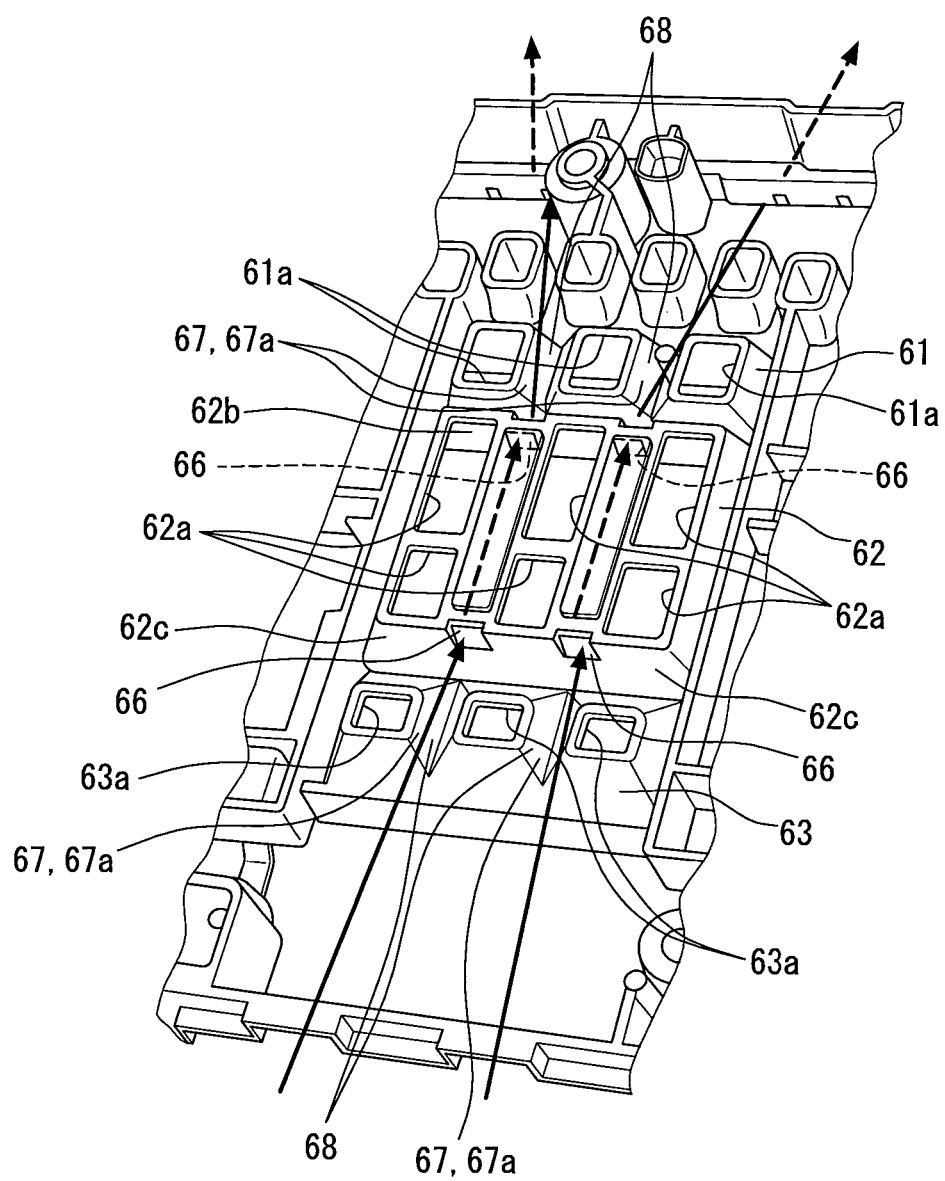
FIG. 6 is a perspective view of the light guiding case in FIG. 1 as viewed from behind.
Figure 7:
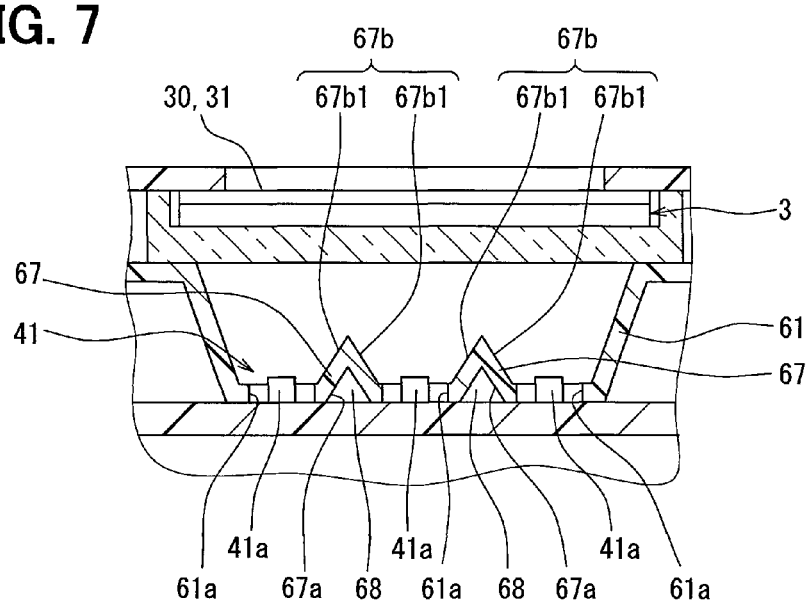
FIG. 7 is an enlarged sectional view taken along line VII-VII of FIG. 4.
Figure 8:
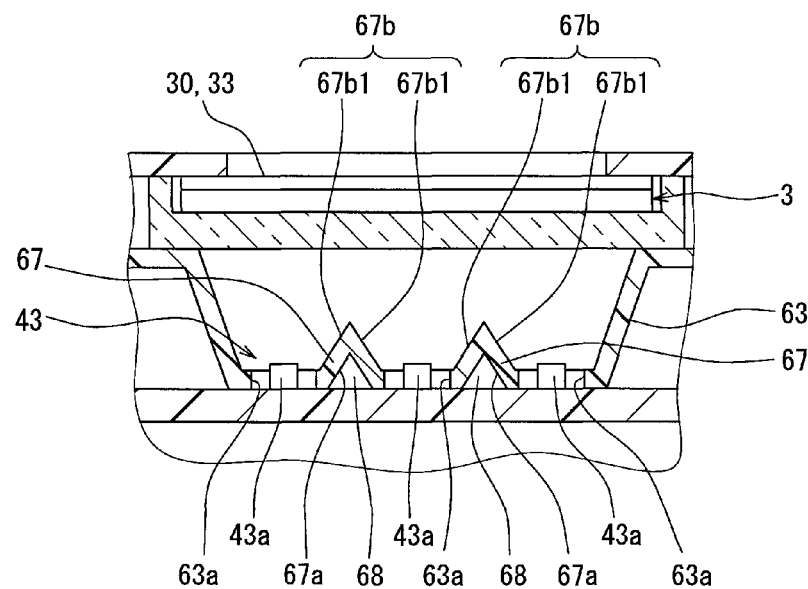
FIG. 8 is an enlarged sectional view taken along line VIII-VIII of FIG. 4.

As shown in FIGS. 6 to 8, the rear face 67a of each chevron portion 67 is recessed frontward so as to form the cross section of the chevron portion 67 to be shaped of chevron and thereby form an air passage 68 for an air flow behind each of the exteriors of the cover portions 61, 63. As shown in FIGS. 4 and 6, the air passage 68 formed by each chevron portion 67 of the cover portion 61 is opposed, in the top and bottom direction, to any one of the air holes 66 that are opened in the top wall 62b of the cover portion 62 adjoining to the cover portion 61 from bottom. As shown in FIGS. 4 and 6, the air passage 68 formed by each chevron portion 67 of the cover portion 63 is opposed, in the top and bottom direction, to any of the air holes 66 that are opened in the bottom wall 62c of the cover portion 62 adjoining to the cover portion 63 from top.

As shown in FIGS. 7 and 8, the front face 67b of each chevron portion 67 is projected frontward so as to form the cross section of the chevron portion 67 to be shaped of chevron. The base portion of the chevron is thereby made to adjoin to any of light sources 41a, 43a in the cover portions 61, 63. Of the front face 67b of each chevron portion 67, the ridge portion of the chevron is formed by a pair of reflecting surfaces 67b1 to reflect the light from the light sources 41a, 43a adjoining to the base portion of the chevron. The chevron portions 67 are lined in the left and right direction in the cover portion 61; each chevron portion 67 has the reflecting surfaces 67b1 that are inclined to be brought farther away from the adjoining light sources 41a in the left and right direction as they go frontward. The chevron portions 67 are lined in the left and right direction in the cover portion 63; each chevron portion 67 has the reflecting surfaces 67b1 that are inclined to be brought farther away from the adjoining light sources 43a in the left and right direction as they go frontward.

(Action and Effect)

Hereafter, a description will be given to the action and effect of the apparatus 1 described up to this point.

In the apparatus 1, the illumination portion 41 including a plurality of light sources 41a illuminates the display area 31 of the display panel 3 from behind; the illumination portion 42 including a plurality of the light sources 42a illuminates the display area 32 of the display panel 3 from behind; and the illumination portion 43 including a plurality of light sources 43a illuminates the display area 33 of the display panel 3 from behind. The total quantity of heat produced by the plurality of light sources 42a in the illumination portion 42 is larger than the total quantity of heat produced by the plurality of light sources 41a in the illumination portion 41. Similarly, the total quantity of heat produced by the plurality of light sources 42a in the illumination portion 42 is larger than the total quantity of heat produced by the plurality of light sources 43a in the illumination portion 43. For these reasons, the apparatus 1 takes the following measure in the cover portion 62 among the cover portion 62 and the cover portions 61, 63 vertically adjoining to the cover portion 62. That is, the cover portion 62 is provided with a plurality of air holes 66 that are opened toward the air passages 68 outside of the cover portion 62 and toward the interior inside of the cover portion 62. As a result, an air flow by natural convection is produced through each air hole 66 as shown by the arrows in FIGS. 5 and 6 between (i) the air passages 68 outside of the cover portion 62 and (ii) the interior of the cover portion 62 where the plurality of light sources 42a are exposed with a large total quantity of heat. This results in accelerating the reduction in the temperature of each light source 42a and enhancing the durability. The cover portions 61, 63 in which the plurality of light sources 41a, 43a are exposed with a small total quantity of heat do not require an air hole 66 unlike the cover portion 62 and an air passage 68 only has to be externally formed. This avoids the leakage of light from each light source 41a, 43a through the hole 66 and enhances energy efficiency. In addition, the interiors of the vertically adjoining cover portions 61, 63 and cover portion 62 are partitioned from each other. This can avoid the mixture of (i) light from each light source 41a, 43a in the cover portions 61, 63 and (ii) light from each light source 42a in the cover portion 62. This mixture avoiding action can precisely luminously display only required information among a variety of the vehicle information notified by the indicator images 31a, 32a, 33a in the individual display areas 31, 32, 33.

Figure 5:
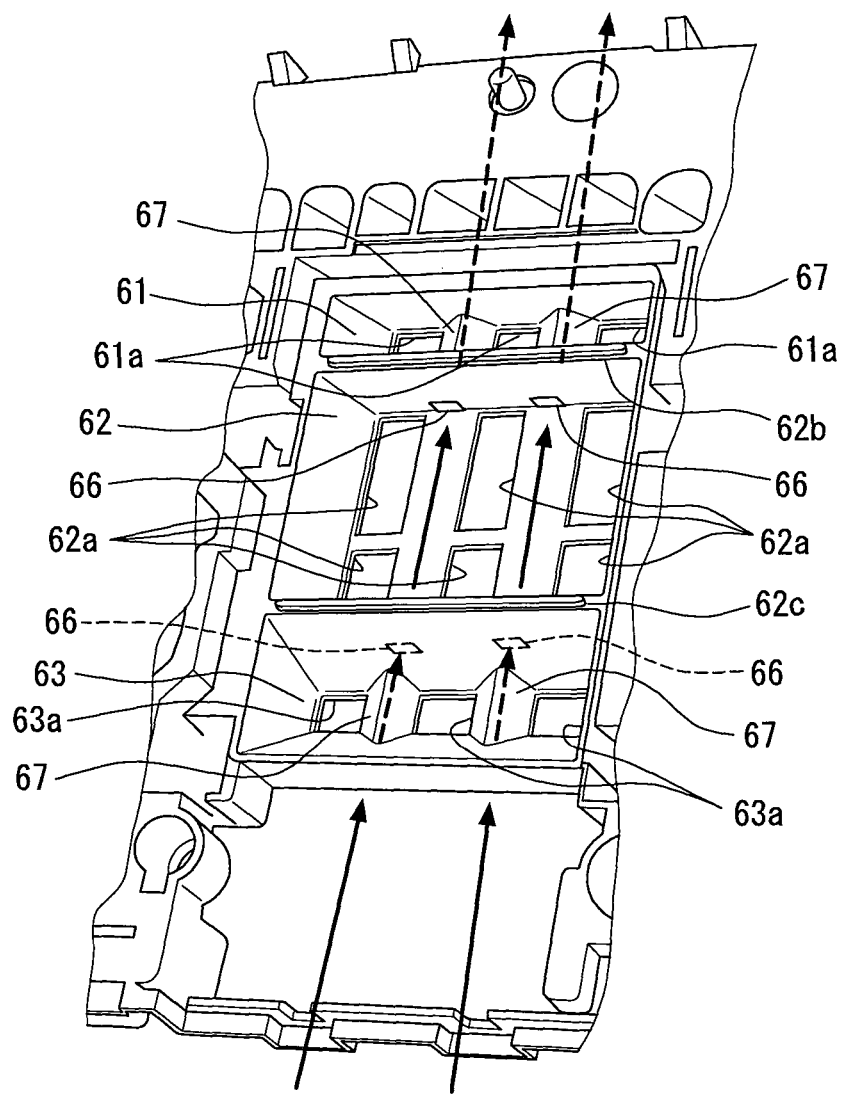
FIG. 5 is a perspective view of a light guiding case in FIG. 1 as viewed from front.

In the apparatus 1, especially, the rear faces 67a are recessed in the plurality of chevron portions 67 of the cover portions 61, 63; such recessed portions serve as the air passages 68 so as to be vertically opposed to any of the air holes 66. This mode of opposition can produce, as shown in FIGS. 5 and 6, an air flow through each air hole 66 by natural convection without fail between each air passage 68 and the interior of the cover portion 62. Further, the base portion of each chevron portion 67 adjoins any of light sources 41a, 43a; the front face 67b of each chevron portion 67 forms a pair of the reflecting surfaces 67b1. The reflecting surfaces 67b1 are inclined and brought farther away from the adjoining light sources 41a, 43a as they go frontward. This mode of inclination can efficiently reflect incident light from any of light sources 41a, 43a frontward. This accelerates the reduction in the temperature of each light source 42a by a positive air flow and can enhance the durability. In addition, light from the light sources 41a, 43a is sufficiently guided to the display areas 31, 33 by highly efficient reflection; this can enhance energy efficiency.

In the apparatus 1, further, the cover portion 62 adjoins from above to the cover portion 63 providing a plurality of air passages 68 outside of the cover portion 63; the cover portion 62 has the air holes 66 that are opened toward each passage 68. This mode of adjacency permits air to flow, as shown in FIGS. 5 and 6, from each air passage 68 located below into the cover portion 62 through each air hole 66 located above. This cools each internal light source 42a, therefore accelerating the reduction in the temperature of each light source 42a and achieving the high durability.

In the apparatus 1, furthermore, the cover portion 62 adjoins from below to the cover portion 61 providing a plurality of air passages 68; the cover portion 62 has the air holes 66 that are opened toward each passage 68. This mode of adjacency permits air in the cover portion 62 to flow, as shown in FIGS. 5 and 6, from each air hole 66 located below into each air passage 68 located above. This releases heat produced by each internal light source 42a, therefore, accelerating the reduction in the temperature of each light source 42a and achieving the high durability.

In the apparatus 1, in addition, the light from the light sources 41a, 43a is different from the light from the light sources 42a2 in luminescent color; the light from the light sources 41a, 43a and the light from the light sources 42a2 travel, respectively, in the cover portions 61, 63 and in the cover portion 62, of which the interior is portioned from the interiors of the cover portions 61, 63. This prevents the light from the light sources 41a, 43a and the light from the light sources 42a2 from mixing together. This can precisely luminously display only required information among a variety of the vehicle information displayed in different luminescent colors by the indicator images 31a, 32a, 33a in the individual display areas 31, 32, 33.

In the apparatus 1, in addition, the number of the component light sources 42a of the illumination portion 42 is set to a larger value than the number of the component light sources 41a, 43a of each of the illumination portions 41, 43 providing a small total quantity of heat. As a result, the total quantity of heat in the illumination portion 42 is larger than the total quantity of heat in each illumination portion 41, 43. In the apparatus 1, however, the adoption of the air passages 68 and the air holes 66 accelerates temperature reduction with respect to each light source 42a of the illumination portion 42 providing a large total quantity of heat, and enables the enhancement of durability.

In the embodiment described up to this point, the display area 31, 33 is equivalent to "first display area"; the illumination portion 41, 43 is equivalent to "first illumination portion"; and the cover portion 61, 63 is equivalent to "first cover portion." The display area 32 is equivalent to "second display area"; the illumination portion 42 is equivalent to "second illumination portion"; and the cover portion 62 is equivalent to "second cover portion."

(Other Embodiments)

Up to this point, the description has been given to an embodiment of the present disclosure. However, the present disclosure should not be interpreted with the scope thereof limited to the embodiment and can be applied to various embodiments without departing from the scope of the present disclosure.

Figure 9:
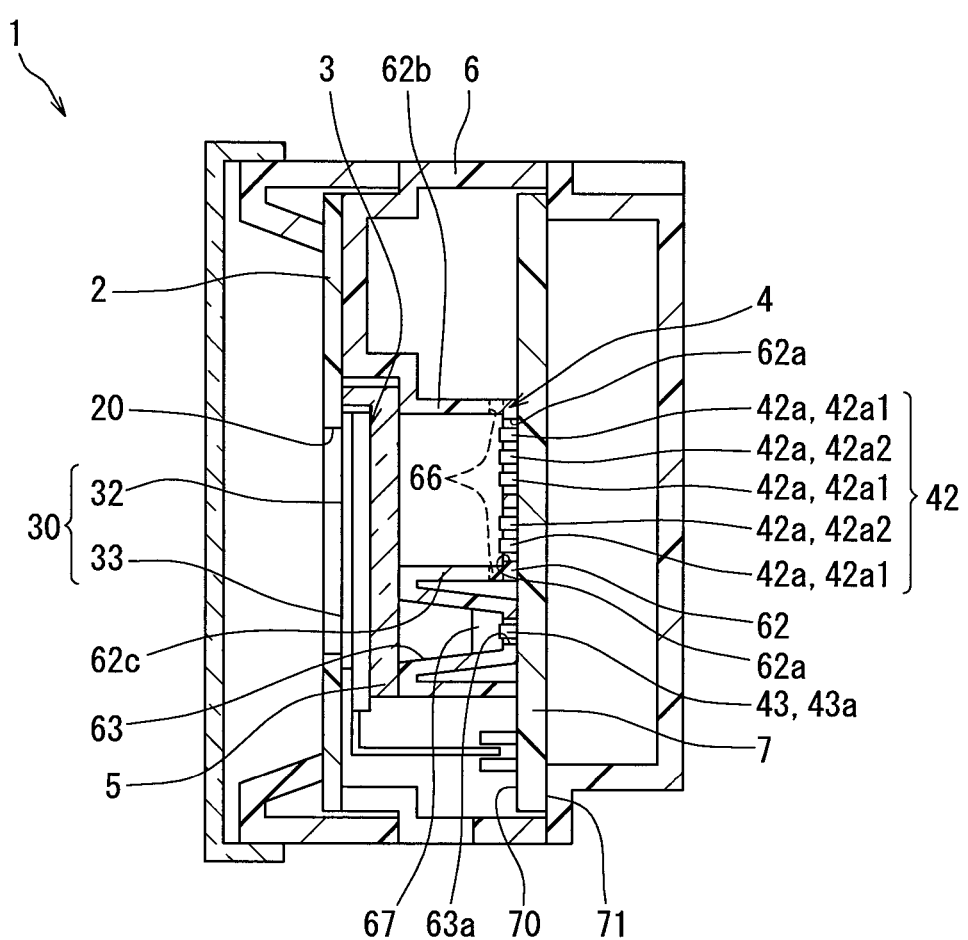
FIG. 9 is a sectional view illustrating a modification of FIG. 3.
Figure 10:
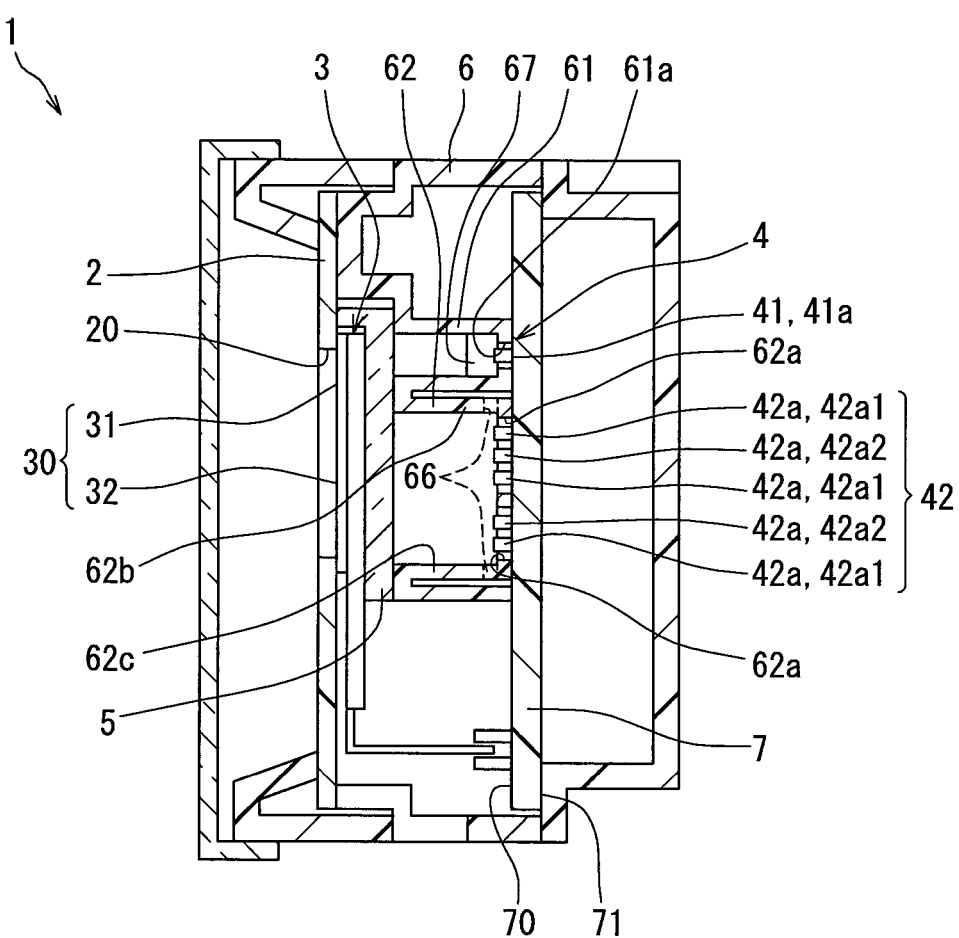
FIG. 10 is a sectional view illustrating a modification of FIG. 3.

Specifically, as in the first and second modifications shown in FIGS. 9 and 10, either the display area 31 or the display area 33, either the illumination portion 41 or the illumination portion 43, or either the cover portion 61 or the cover portion 63 may not be provided.

As a third modification, the illumination portions 41, 43 may include light sources 41a, 43a in ordinary color and light sources 41a, 43a in alert color in accordance with the illumination portion 42. As a fourth modification, of the component light sources 42a of the illumination portion 42, the light sources 42a2 in alert color may be replaced with light sources 42a1 in ordinary color. Further, as a fifth modification, the component light sources 41a, 42a, 43a of each illumination portion 41, 42, 43 may be provided by any identical number, for example, one, other than in the above embodiment. In the fifth modification, however, the total quantity of heat produced by the component light sources 42a of the illumination portion 42 is set to a value larger than each of the following total quantities of heat because of difference in the passed current controlled by the control circuit 73: the total quantity of heat produced by the component light sources 41a of the illumination portion 41; and the total quantity of heat produced by the component light sources 43a of the illumination portion 43.

Figure 11:
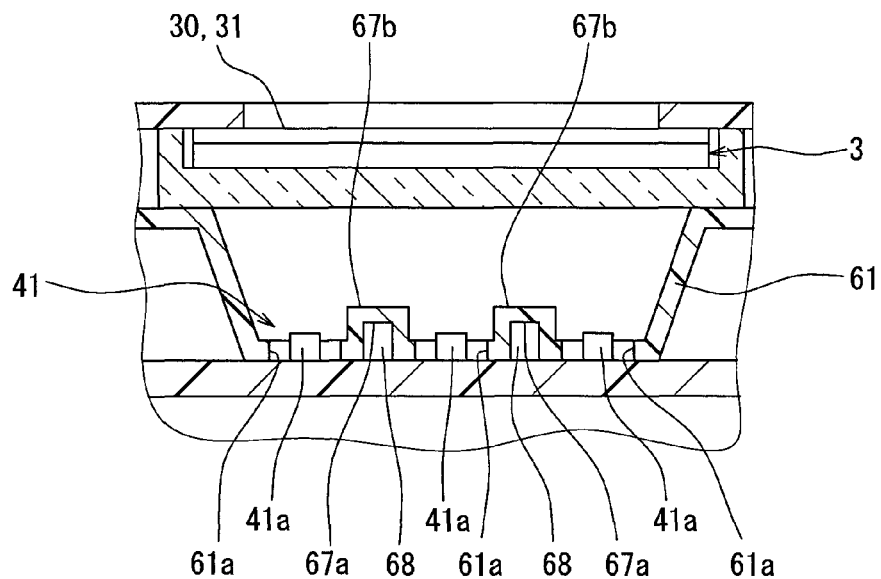
FIG. 11 is an enlarged sectional view illustrating a modification of FIG. 7.
Figure 12:
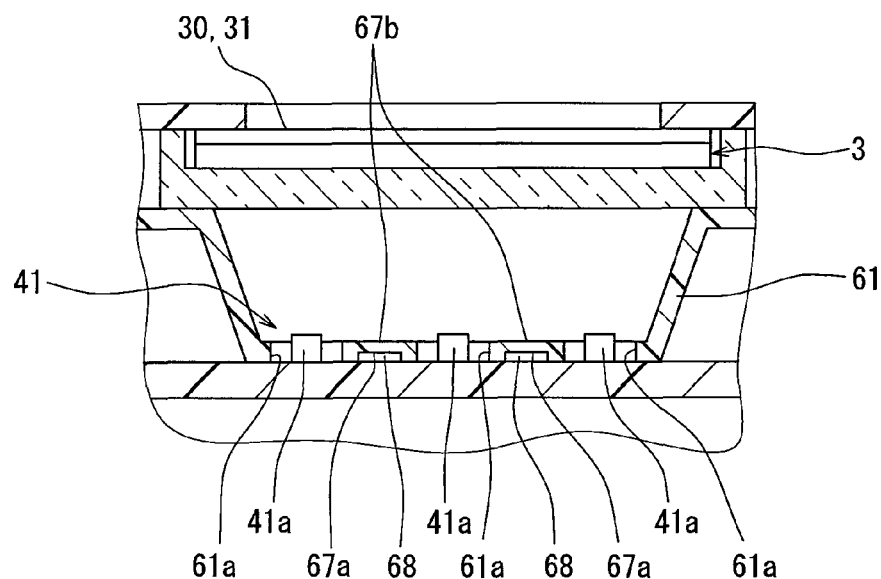
FIG. 12 is an enlarged sectional view illustrating a modification of FIG. 7.

As a sixth modification, the chevron portions 67 of each cover portion 61, 63 may be by any number, for example, one other than in the above embodiment. As a seventh modification, as illustrated in FIG. 11, the rear faces 67a of the cover portions 61, 63 are recessed so that the cross sections of the cover portions are in the shape of rectangle or the like not in the shape of chevron to form the air passages 68; and the front faces 67b of the cover portions 61, 63 are projected so that the cross sections thereof are in the shape of rectangle or the like not in the shape of chevron. (FIG. 11 illustrates the seventh modification of the cover portion 61.) As an eighth modification, as illustrated in FIG. 12, the rear faces 67a of the cover portions 61, 63 are recessed so that the cross sections thereof are in the shape of chevron or any other shape to form the air passages 68. However, the front faces 67b of the cover portions 61, 63 may be formed into the shape of flat face or the like without being projected frontward (FIG. 12 illustrates the eighth modification of the cover portion 61).

As a ninth modification, the air passages 68 may be formed beside the exteriors of the cover portions 61, 63 by recessing the side faces of the cover portions 61, 63 in the left and right direction or taking any other like measure. As a 10th modification, the air passage 68 may be formed between a pair of ridges projected behind or beside the exteriors of the cover portions 61, 62.

As an 11th modification, the air passage 68 may be provided by any number, for example, one other than in the above embodiment and the air holes 66 may be accordingly provided by any number, for example, one other than in the above embodiment. As a 12th modification, the position of each air hole 66 in the left and right direction may match the position of each exposure hole 62a in the left and right direction.

As a 13th modification, each display area 31, 32, 33 of the display panel 3 may be modified so that the following is implemented in addition to displaying a variety of vehicle information to be notified by the indicator images 31a, 32a, 33a: for example, such a vehicle state value as on the pointer instruments 21 is displayed as vehicle information in the form of image. As a 14th modification, an EL (Electro-Luminescence) panel or the like may be adopted for the display panel 3 in placed of such a liquid crystal panel as in the above embodiment. As a 15th modification, color display may be implemented by such a display panel 3 as the liquid crystal panel in the above embodiment. As a 16th modification, the cover portions 64, 65 may be configured in accordance with the present disclosure by dividing each display area 22 of the display plate 2 into a plurality of "display portions."

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A vehicular display apparatus comprising:
a display portion that displays vehicle information in each of a first display area and a second display area;
a first illumination portion that includes at least one first light source and illuminates the first display area from behind by causing the first light source to emit light;
a first cover portion that is placed behind the first display area, the first cover portion exposing the first light source of the first illumination portion to an interior of the first cover portion;
a second illumination portion that includes at least one second light source and illuminates the second display area from behind by causing the second light source to emit light; and
a second cover portion that is placed behind the second display area, the second cover portion vertically adjoining to the first cover portion and having an interior that is partitioned from the interior of the first cover portion, the second cover portion exposing the second light source of the second illumination portion to the interior of the second cover portion,
wherein:
the first cover portion forms an air passage outside of the first cover portion for an air flow; and
the second cover portion includes an air hole that is opened to communicate the interior of the second cover portion with the air passage outside of the first cover portion.

2. The vehicular display apparatus according to claim 1, wherein the first cover portion forms the air passage by a recess, the air passage vertically opposed to the air hole.

3. The vehicular display apparatus according to claim 2, wherein:
the first cover portion includes a plurality of chevron portions;
the chevron portion has
a rear face that is recessed to be shaped of a chevron to form the air passage and
a front face that is projected to be shaped of the chevron, the front face reflecting light from the first light source; and
the first light source is exposed to the interior of the first cover portion from a place adjoining to a base portion of the chevron of the chevron portion.

4. The vehicular display apparatus according to claim 1, wherein the second cover portion is provided to adjoin to the first cover portion from above.

5. The vehicular display apparatus according to claim 1, wherein the second cover portion is provided to adjoin to the first cover portion from below.

6. The vehicular display apparatus according to claim 1, wherein the second illumination portion includes the second light source different in luminescent color from the first light source.

7. The vehicular display apparatus according to claim 1, wherein the number of the second light sources of the second illumination portion is larger than the number of the first light sources of the first illumination portion.

8. The vehicular display apparatus according to claim 1, wherein a total quantity of heat produced by the second light source of the second illumination portion is larger than a total quantity of heat produced by the first light source of the first illumination portion.

* * * * *